United States Patent [19]

Kato et al.

[11] Patent Number: 5,614,988
[45] Date of Patent: Mar. 25, 1997

[54] PROJECTION EXPOSURE APPARATUS AND METHOD WITH A PLURALITY OF PROJECTION OPTICAL UNITS

[75] Inventors: Kinya Kato, Yokohama; Masami Seki, Shiki, both of Japan

[73] Assignee: Nikon Corporation, Japan

[21] Appl. No.: 349,754

[22] Filed: Dec. 5, 1994

[30]  Foreign Application Priority Data

Dec. 6, 1993  [JP]  Japan .................................. 5-339770

[51] Int. Cl.$^6$ ........................... G03B 27/44; G03B 27/32
[52] U.S. Cl. ............................................... 355/46; 355/77
[58] Field of Search ................................ 355/46, 53, 77

[56]  References Cited

U.S. PATENT DOCUMENTS

| | | | |
|---|---|---|---|
| 5,159,172 | 10/1992 | Goodman et al. | 359/858 |
| 5,298,939 | 3/1994 | Swanson et al. | 355/53 |
| 5,401,934 | 3/1995 | Ainsworth et al. | 219/121.18 |

FOREIGN PATENT DOCUMENTS 55-119036  9/1980  Japan .

*Primary Examiner*—Fred L. Braun
*Attorney, Agent, or Firm*—Pennie & Edmonds

[57]  ABSTRACT

A projection exposure apparatus and method having a projection optical system with a plurality of projection optical units and being excellent in matching between images formed through the respective projection optical units. First and second substrates are moved relatively to a projection optical system to project a pattern formed on the first substrate through the projection optical system onto the second substrate to effect exposure thereon. The projection optical system is provided with a plurality of projection optical units each forming a real-size erect image of the pattern formed on the first substrate on the second substrate. Each of the projection optical units has a plurality of reflective surfaces and is telecentric at least on an image side. The projection exposure apparatus also has a correcting mechanism disposed to correct an error of orientation between a plurality of images formed on the second substrate by the plurality of projection optical units.

16 Claims, 10 Drawing Sheets

PROJECTION EXPOSURE APPARATUS AND METHOD WITH A PLURALITY OF PROJECTION OPTICAL UNITS

BACKGROUND OF THE INVENTION

1. Field of the Invention

The present invention relates to a projection exposure apparatus, and more particularly to a projection exposure apparatus which can correct errors of orientations of images obtained from a plurality of projection optical units.

2. Related Background Art

Liquid crystal display panels are frequently used these days as a display device for word processors, personal computers, televisions, etc. The liquid crystal display panels are fabricated by patterning of transparent thin-film electrodes in a desired pattern on a glass substrate by the photolithography technique. As an apparatus for the lithography a mirror projection type aligner is used for exposure-printing an original pattern formed on a mask onto a photoresist layer on a glass substrate through a projection optical system.

Meanwhile, in order to enlarge the exposure area, the conventional mirror projection type aligners performed exposure while dividing the exposure area. Specifically, the exposure area on a plate as an exposed substrate is divided into four regions, and with scanning exposure of a first mask and a first region a circuit pattern of the first mask is transferred onto the first region. Then, exchanging the first mask for a second mask, the plate is moved in a step manner so that the second region comes to overlap with the exposure area of the projection optical system. Then performing scanning exposure of the second mask and the second region, a circuit pattern of the second mask is transferred onto the second region. After that, the same steps are repeated for a third mask and a third region and for a fourth mask and a fourth region, whereby a circuit pattern of the third mask or the fourth mask is transferred onto the third region or the fourth region, respectively.

In the case of the divisional exposure of the exposure area as described, the throughput (an amount of exposure substrate per unit time) is low because a plurality of scanning exposures are necessary. Further, there are seams between adjacent divided exposure regions and, therefore, the stitching accuracy must be enhanced. Thus, the magnification error of projection optical system needs to be decreased as close to zero as possible and a great improvement in alignment accuracy is required, thus increasing the costs of apparatus.

On the other hand, it can be conceivable that the scale of projection optical system be increased for full scanning exposure of a large exposure area without dividing the exposure area. However, in order to increase the scale of projection optical system, large-scale optical elements must be produced with very high accuracy, which would result in increasing the production cost and the size of apparatus. Also, the size increase of projection optical system would cause an increase in aberrations or degradation in imaging performance.

SUMMARY OF THE INVENTION

An object of the present invention is to provide a projection exposure apparatus which has a projection optical system consisting of a plurality of projection optical units and which is excellent in matching between images formed through the respective projection optical units.

The above object and other objects will be further apparent from the following description.

Provided according to the present invention is a projection exposure apparatus which is arranged no relatively move first and second substrates relative to a projection optical system, thereby projecting a pattern formed on the first substrate through the projection optical system onto the second substrate to effect exposure thereon, wherein the projection optical system is provided with a plurality of projection optical units each forming a real-size erect image of the pattern formed on the first substrate, on the second substrate, wherein each of the projection optical units has a plurality of reflective surfaces and is telecentric at least on an image side, which comprises correcting means for correcting an error of orientation between a plurality of images formed on the second substrate by the plurality of projection optical units.

In the present invention, a scanning projection exposure apparatus has a projection optical system consisting of a plurality of projection optical units, in which light and dark grating patterns are located at positions corresponding to the projection pattern plane and the image plane of projection optical system. Each of the grating patterns is a pattern in which transparent portions and opaque portions are alternately arranged at equal intervals and in parallel with each other, and the two grating patterns are arranged substantially in parallel with each other and substantially in the same orientation. Then, receiving illumination light through the two light and dark grating patterns and the projection optical system, moire fringes are observed with each of the projection optical units.

As detailed later, pitches of moire fringes observed with the respective projection optical units are equal to each other as long as orientations of the images formed through the respective projection optical units are equal to each other. In other words, measuring pitches of moire fringes with two projection optical units, an orientation error can be detected between two images formed through the respective projection optical units.

Accordingly, if directions of reflective surfaces in the respective projection optical units are arranged to be approximately uniform so as to keep the pitches of moire fringes equal, the orientations of the images formed through the respective projection optical units can be kept approximately uniform. As a result, projection exposure can be made with high matching between the projection optical units.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Embodiments of the present invention will be described based on the accompanying drawings.

Figure 1:
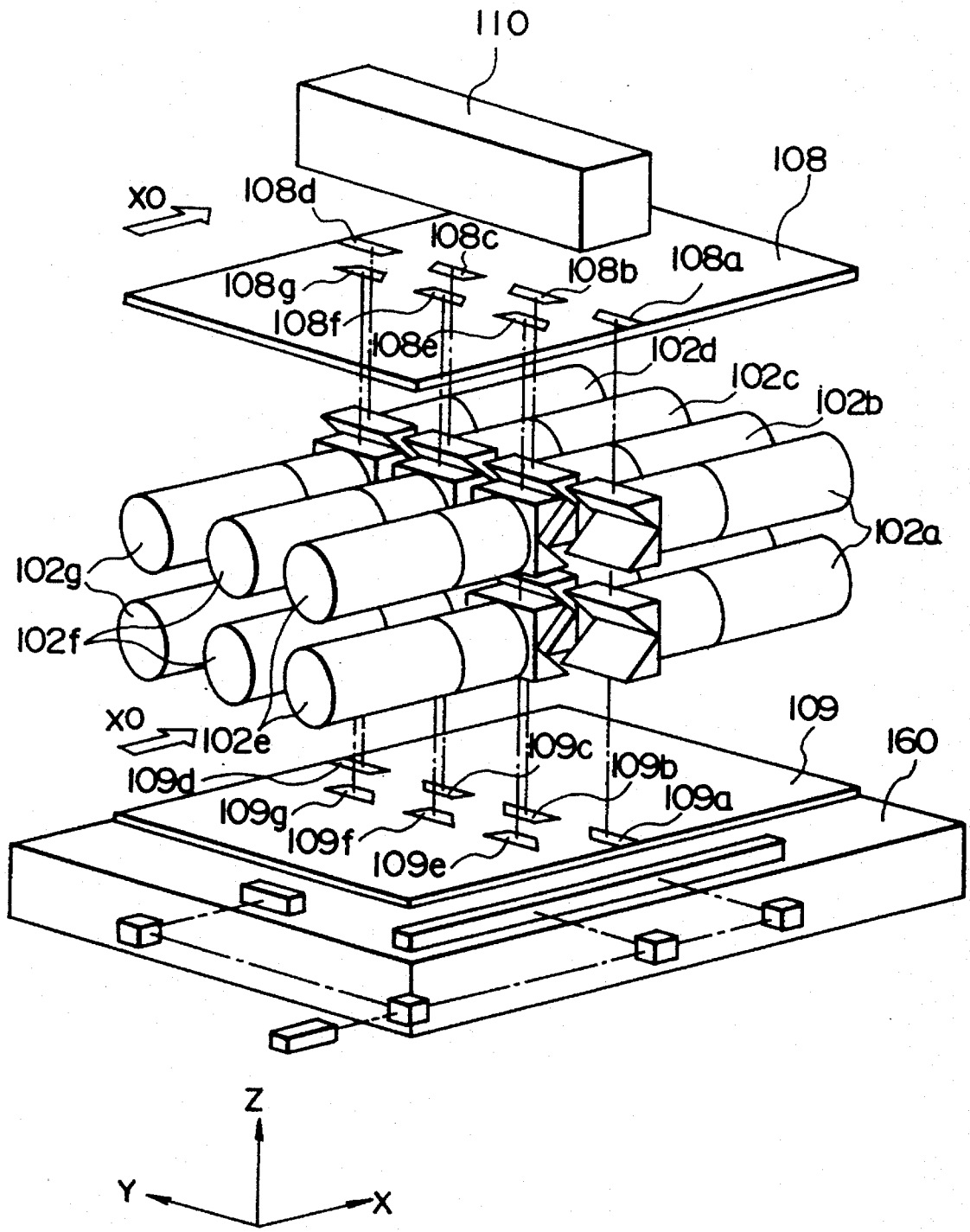
FIG. 1 is a perspective view to show the structure of a projection exposure apparatus to which the present invention is applied.
Figure 2:
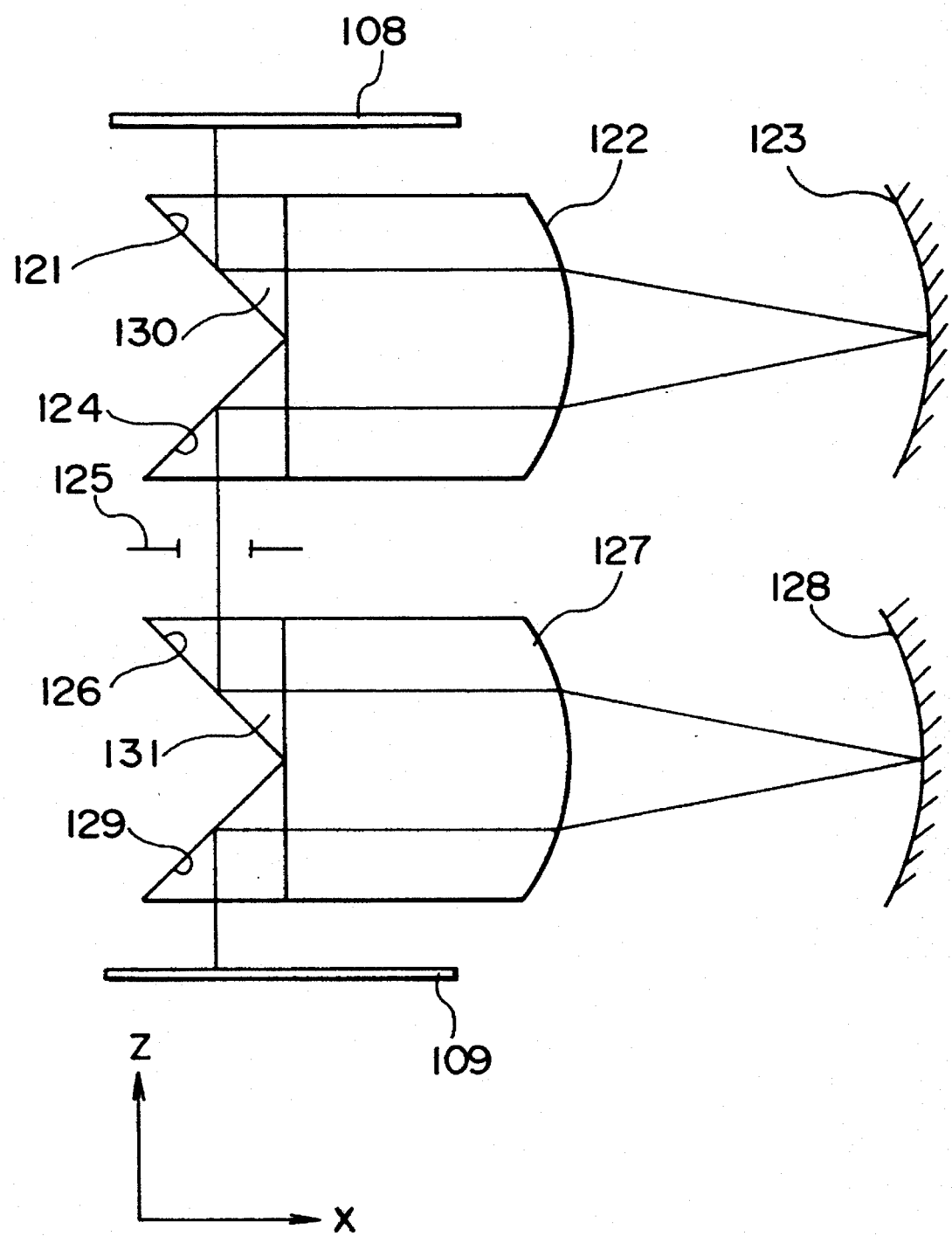
FIG. 2 is a side view to show the structure of a projection optical system used in the projection exposure apparatus shown in FIG. 1.

FIG. 1 is a perspective view to show the structure of the projection exposure apparatus according to an embodiment of the present invention. Also, FIG. 2 is a drawing to show the structure of a projection optical system in the projection exposure apparatus of FIG. 1.

In FIG. 1, the X axis is taken along a direction (scanning direction) in which a mask 108 on which a predetermined circuit pattern is formed and a plate 109 made of a glass substrate coated with a photoresist are carried, the Y axis along a direction perpendicular to the X axis in the plane of the mask 108, and the Z axis along a direction normal to the mask 108. The way to define the coordinate system is common to the other drawings.

The projection exposure apparatus as shown is provided with an illumination optical system 110 for uniformly illuminating the mask 108 set in the XY plane in the drawing. A projection optical system consisting of a plurality of projection optical units 102a to 102g is set below the mask 108. The projection optical units have the same structure. Further below the projection optical system, the plate 109 is mounted on a stage 160 so as to be nearly parallel with the XY plane.

During scanning exposure the mask 108 and plate 109 are moved in an incorporated manner in the direction of the arrow XO in the drawing.

A projection optical unit shown in FIG. 2 is composed of a first partial optical system (121 to 124), a field stop 125, and a second partial optical system (126 to 129). Each of the first partial optical system (121 to 124) and the second partial optical system (126 to 129) is a Dyson type optical system and they have the same structure.

The first partial optical system is composed of a first reflective surface 121 of prism 130 for deflecting light from the mask 108 into the direction of the X axis (to the right in the drawing), a plano-convex lens 122 for converging the light reflected by the first reflective surface 121, a concave mirror 123 for reflecting the light having passed through the plano-convex lens 122 toward the plano-convex lens 122, and a second reflective surface 124 of prism 130 for deflecting downward in the drawing the light incident thereonto through the plano-convex lens 122.

As described above, the first partial optical system and second partial optical system have exactly the same structure. Although FIG. 2 shows different reference numerals of constituents of the second partial optical system from those of constituents of the first partial optical system, the redundant description is omitted as to the structure of the second partial optical system.

The illumination light having passed through the mask 108 is deflected to the right in the drawing by the first reflective surface 121 of prism 130 to enter the plano-convex lens 122. The light converged by the plano-convex lens 122 is reflected to the left in the drawing by the concave mirror 123 to again enter the plano-convex lens 122. The light having passed through the plano-convex lens 122 is deflected downward in the drawing by the second reflective surface 124 of prism 130 to form a primary image of the pattern on the mask 108 between the first partial optical system and the second partial optical system.

The primary image thus formed by the first partial optical system (121 to 124) is a real-size image of mask 108 with the X-directional lateral magnification being positive and the Y-directional lateral magnification being negative. The field stop 125 is located at a position where the primary image is formed.

Light from the primary image through the field stop 125 is deflected to the right in the drawing by the first reflective surface 126 of prism 131 in the second partial optical system to enter the plano-convex lens 127. The light converged by the plano-convex lens 127 is reflected to the left in the drawing by the concave mirror 128 to again enter the plano-convex lens 127. The light having passed through the plano-convex lens 127 is deflected downward in the drawing by the second reflective surface 129 of prism 131 to form a secondary image of the pattern of mask 108 on the plate 109.

As described above, the first partial optical system and second partial optical system have exactly the same structure, and the second partial optical system forms a real-size image of the primary image with the X-directional lateral magnification being positive and the Y-directional lateral magnification being negative. Accordingly, the secondary image formed on the plate 109 through the first and second partial optical systems is a real-size erect image (which is an image with the X-directional and Y-directional lateral magnifications both being positive) of mask 108. Here, the projection optical unit composed of the first and second Dyson type partial optical systems is a both-side (both object-side and image-side) telecentric optical system.

Generally, a Dyson type optical system has a maximum field region, which is defined as a region where the aberrations are sufficiently small, of a nearly semicircular shape. Accordingly, an aperture formed in the field stop 125 is determined within the semicircular maximum field region.

In the present embodiment a trapezoid aperture is formed in the field stop 125.

In FIG. 1, field stops provided in the respective projection optical units 102a to 102g define trapezoid field regions 108a to 108g on the mask 108. Images of these field regions 108a to 108g are formed as real-size erect images in exposure regions 109a to 109g on the plate 109 through the projection optical system.

Here, the projection optical units 102a to 102d are so arranged that corresponding field regions 108a to 108d are aligned on a line in the Y direction, i.e., in the direction perpendicular to the scanning direction in the drawing. On the other hand, the projection optical units 102e to 102g are so arranged that corresponding field regions 108e to 108g are aligned on a different line from that of the field regions 108a to 108d in the Y direction.

The projection optical system is so arranged that the longitudinal direction of projection optical units 102a to 102d and the longitudinal direction of projection optical units 102e to 102g both are parallel to the X axis and that the reflective surfaces in the projection optical units 102a to 102d are proximate to those in the projection optical units 102e to 102g, i.e., that the first group of projection optical units 102a to 102d are opposed to the second group of projection optical units 102e to 102g. Further, the first group and the second group are alternately arranged in the order of the projection optical units 102a, 102e, 102b, 102f, 102c, 102g, 102d along the Y direction.

The field regions 108a to 108g on the mask 108 are defined by the shape of the respective apertures in the field stops in the corresponding projection optical units. Therefore, there is no need to provide the illumination optical system 110 with an optical system for exactly defining the field regions 108a to 108g.

As described, the exposure regions 109a to 109d are formed linearly along the Y direction on the plate through the projection optical units 102a to 102d, while the exposure regions 109e to 109g are formed linearly along the Y direction on the plate 109 through the projection optical units 102e to 102g. These exposure regions 109a to 109g are real-size erect images of the field regions 108a to 108g on the mask 108.

Next described is a positional relation on the mask 108 between the field regions 108a to 108g defined by the projection optical units 102a to 102g.

Shorter sides of the trapezoid field regions 108a to 108d are arranged to oppose shorter sides of the trapezoid field regions 108e to 108g, and, further, triangular edges of each field region overlap in the X direction (scanning direction) with corresponding triangular edges of field regions adjacent thereto.

The reason why the first group of field regions 108a to 108d and the second group of field regions 108e to 108g are alternately arranged in the Y direction as described is that, because each projection optical unit is a both-side telecentric optical system, areas occupied by the projection optical units 102a to 102g on the XY plane become greater than the corresponding field regions 108a to 108g.

Namely, where the field regions 108a to 108d are defined by the field stops in the linearly arranged projection optical units 102a to 102d, there are clearances between the regions in the Y direction. As a result, a continuous exposure region in the Y direction on the plate 109 cannot be secured only with the projection optical units 102a to 102d. Then the projection optical units 102e to 102g are added to supplement the clearances in the Y direction between the field regions 108a to 108d by the corresponding field regions 108e to 108g, thus securing the continuous exposure region in the Y direction.

With the field regions 108a to 108g on the mask 108 as described, a sum of lengths of field regions along the scanning direction (X direction) is constant at any position in the direction (Y direction) perpendicular to the scanning direction. This means that with the exposure regions 109a to 109g as real-size erect images of the field regions, a sum of lengths of field regions along the scanning direction (X direction) is constant at any position in the direction (Y direction) perpendicular to the scanning direction. As a result, an exposure quantity distribution uniform over the entire surface of the plate 109 can be obtained by scanning exposure.

Figure 3:
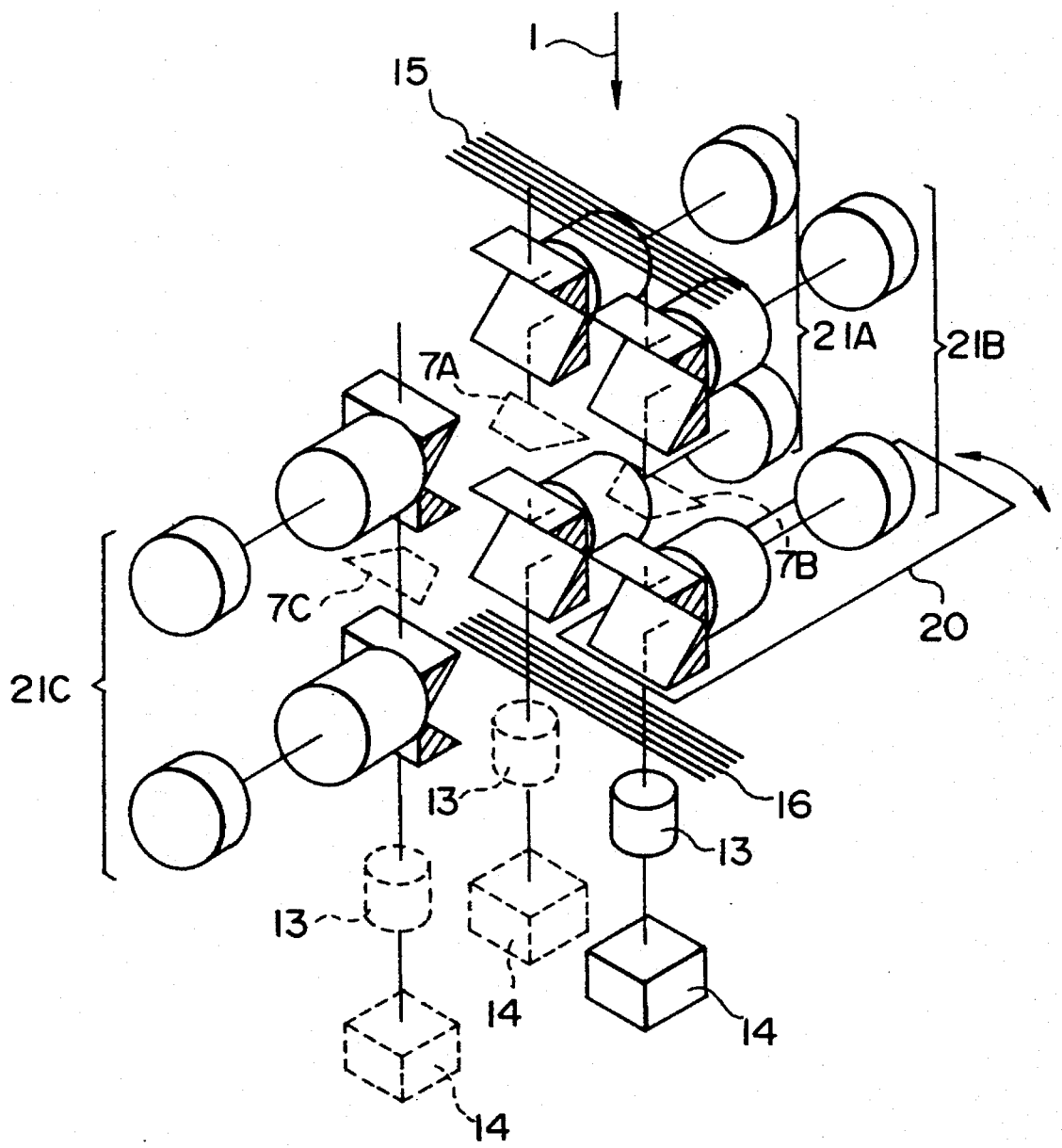
FIG. 3 is a perspective view to show the schematic structure of a projection exposure apparatus having a correcting means according to an embodiment of the present invention.

FIG. 3 is a drawing to show the schematic structure of a projection exposure apparatus having a correcting means according to an embodiment of the present invention. In FIG. 3, projection optical units 21A to 21C are Dyson type optical systems having the structure shown in FIG. 2.

The correcting means shown in FIG. 3 is provided with a grating pattern 15 of light and dark stripes located at a position corresponding to the projection pattern plane of the projection optical system. This grating pattern 15 may be set on a portion on a mask stage (not shown) supporting the mask 108, or may be provided separately from this mask stage.

Further, another grating pattern 16 of light and dark stripes, having the same structure as the grating pattern 15, is provided at a position corresponding to the image plane of the projection optical system. This grating pattern 16 may be set on a portion on a stage 160 (not shown) supporting the plate 109, or may be provided separately from this stage 160. The grating patterns 15 and 16 are patterns of a same pitch (which are patterns in which transparent portions and opaque portions are alternately arranged at equal intervals and in parallel with each other) which are positioned substantially in parallel with each other and substantially in a same orientation. FIG. 3 shows only part of the grating patterns 15 and 16 for clarity of the drawing.

The correcting means shown in FIG. 3 is further provided with a receiving lens 13 disposed below the projection optical system in the drawing and an image sensor 14 disposed further below the receiving lens 13. The receiving lens 13 is telecentric at least on the object side (on the side of the projection optical units 21A to 21C). As shown by the dashed lines in the drawing, the receiving lens 13 and image sensor 14 are arranged as movable together in directions along the image plane of each of the projection optical units and can be consecutively moved to below each projection optical unit. Further, the grating pattern 16 is conjugate with a light-receiving surface of the image sensor 14.

In this arrangement, the illumination light 1 from the illumination optical system (not shown) travels through the grating pattern 15, each projection optical unit, and the grating pattern 16 and through the receiving lens 13 to be received by the image sensor 14.

If the receiving lens 13 were not telecentric on the object side, variations of a distance between the receiving lens 13 and the grating pattern 16 would change the magnification on the image sensor 14 so as to make accurate detection of pitch difficult, thus being not preferable. Since the present embodiment is so arranged that the receiving lens 13 is telecentric on the object side, the pitch can be detected accurately even with variations in distance to the grating pattern when the receiving lens 13 and image sensor 14 move together.

Figure 4:
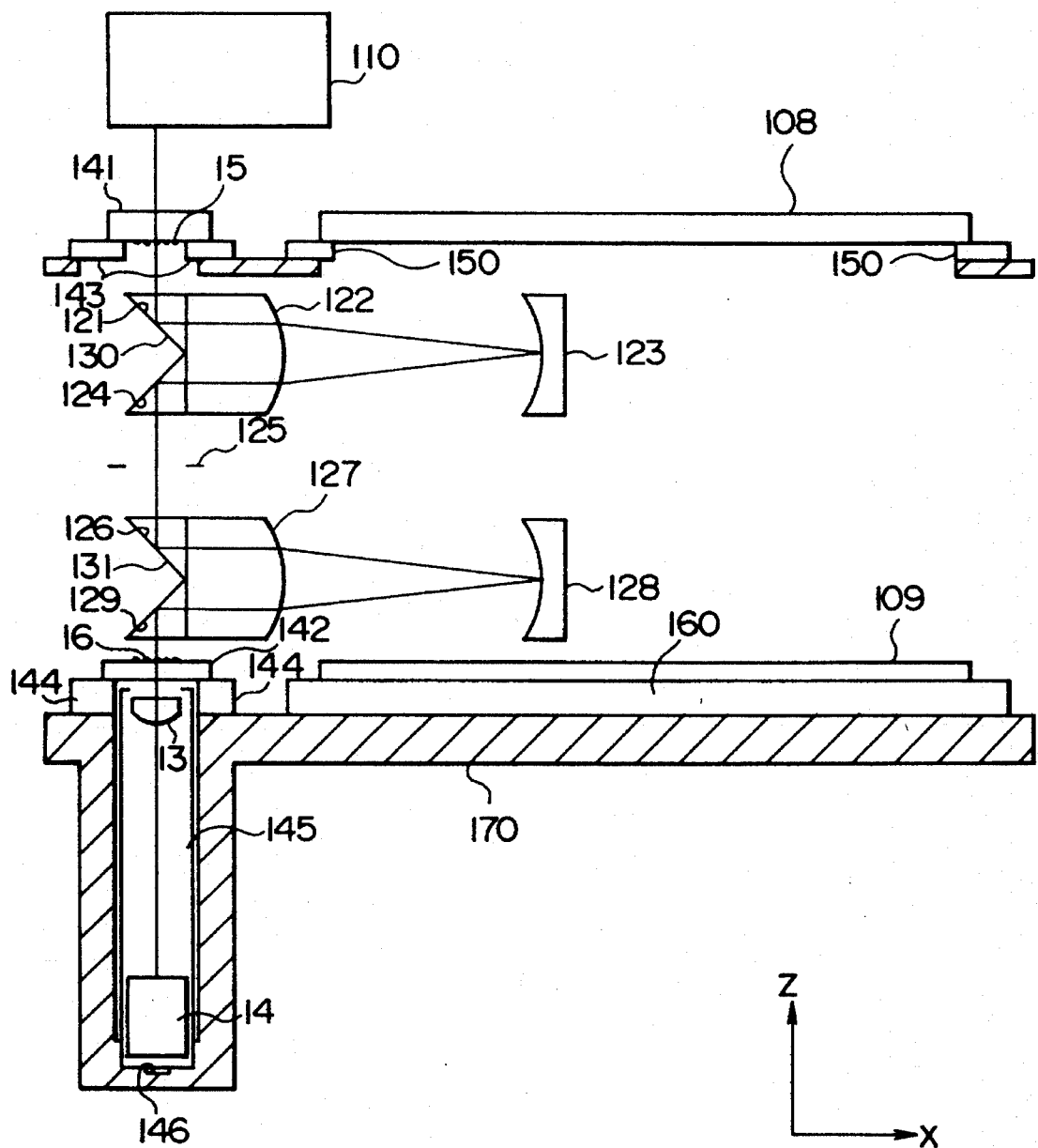
FIG. 4 is a side view to show the detailed structure of the projection exposure apparatus having the correcting means according to the embodiment of the present invention.
Figure 5:
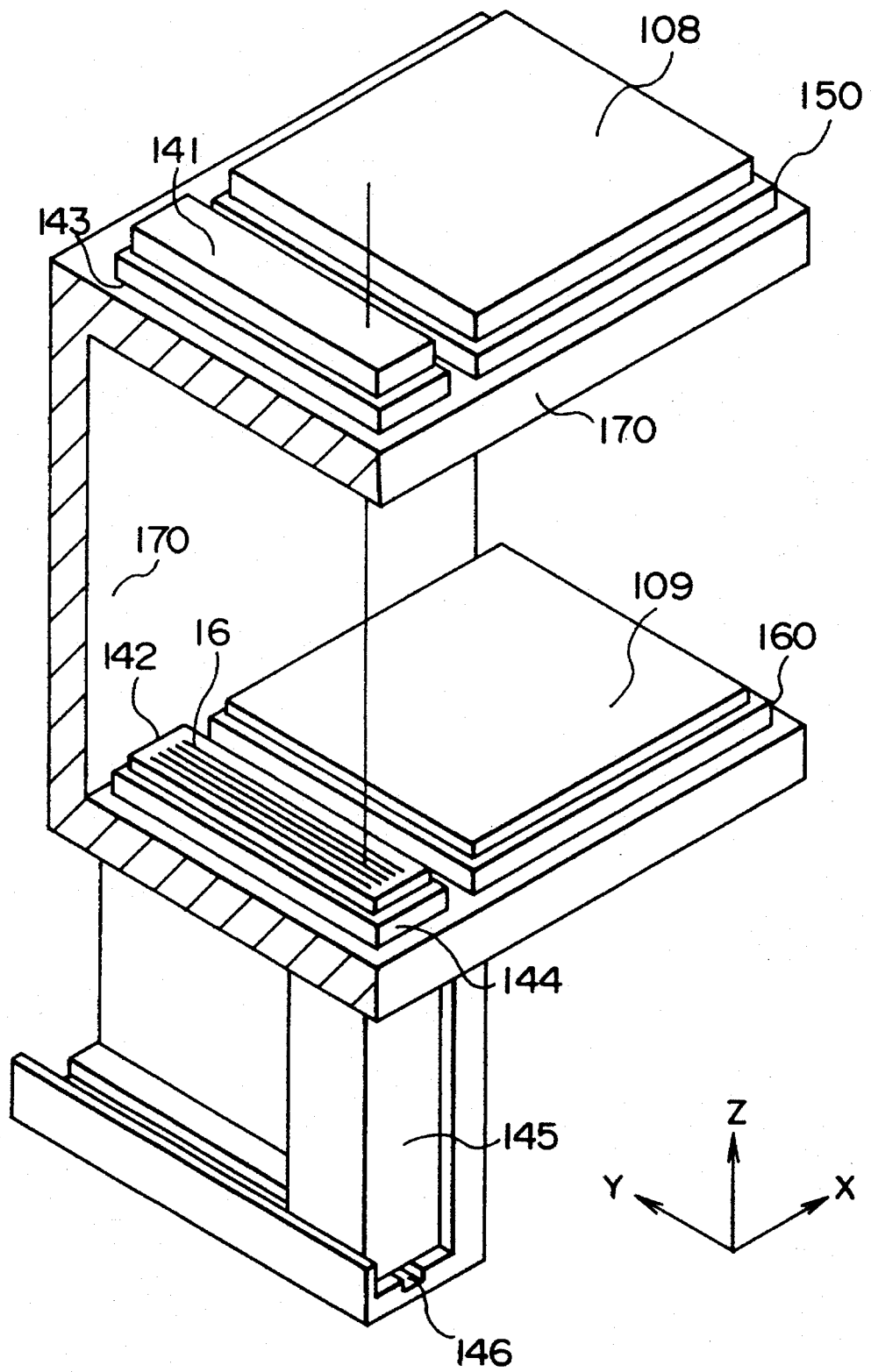
FIG. 5 is a perspective view to show the schematic stage structure in the embodiment of the present invention.

FIG. 4 is a side view to show the detailed structure of the present embodiment and FIG. 5 is a perspective view to schematically show the structure of the stages in the present embodiment. The coordinate system of FIG. 4 and FIG. 5 corresponds to that of FIG. 1.

In FIG. 5, the mask 108 is mounted by the technique of vacuum suction on the mask stage 150 movable in the XY plane. This mask stage 150 has an aperture for letting exposure light having passed through the mask 108 pass therethrough, as shown in FIG. 4. A pattern surface (where the pattern is provided) of the mask 108 mounted on the mask stage 150 is on the bottom side (on the side of plate 109).

The plate 109 is mounted by the technique of vacuum suction on the plate stage 160 movable in the XY plane. Here, the mask stage 150 and plate stage 160 are set on a carriage 170 having a "C-shaped" cross section in the YZ plane. This carriage 170 is arranged as movable along the X direction.

A glass support table 143 supporting a substrate glass 141 having the grating pattern 15 is fixed on a portion (an end portion adjacent to the mask stage 150 on the carriage 170) different from the mask stage 150 on the carriage 170. As shown in FIG. 4, this glass support table 143 also has an aperture for letting the light from the illumination optical system 130, having passed through the grating pattern 15, pass therethrough. The grating pattern 15 on the substrate glass 141 mounted on the glass support table 143 is formed on the bottom side (on the side of plate 109), so that it is located in the same plane as the pattern surface of mask 108 on the mask stage 150.

A glass support table 144 supporting a substrate glass 142 having the grating pattern 16 is fixed on a portion different from the plate stage 160 on the carriage 170. As shown in FIG. 4, this glass support table 144 has an aperture for letting the light having passed through the grating pattern 16 pass therethrough. The grating pattern 16 on the substrate glass 142 mounted on the glass support table 144 is located in the same plane as the plane on the top side (on the side of mask 108) of plate 109. The grating pattern 15 on the glass substrate 141 and the grating pattern 16 on the glass substrate 142 have the pitch along the X direction in the drawing.

Further, the carriage 170 has a guide 146 which is a groove extending in the Y direction in the drawing. Here, a detection unit 145 for taking an image of moire fringes formed by the grating patterns 15 and 16 is set as movable in the groove of guide 146. Accordingly, the detection unit 145 is movable along the Y direction in the drawing. Although not shown, the detection unit 145 is provided with a linear encoder, whereby it can detect a Y-directional position of the detection unit 145.

As shown in FIG. 4, the detection unit 145 is provided with an imaging lens 13 and an image sensor 14. Here, the imaging lens 13 makes the grating pattern 16 on the glass substrate 142 conjugate with an image pickup surface of the image sensor 14. Further, the projection optical system (121 to 129) disposed between the grating patterns 15 and 16 makes the grating pattern 16 on the glass substrate 142 conjugate with the grating pattern 15 on the glass substrate 141, so that an image of the grating pattern 15 (more precisely a tertiary image thereof) and an image of the grating pattern 16 (more precisely a primary image thereof) are formed on the image sensor 14.

Figure 6:
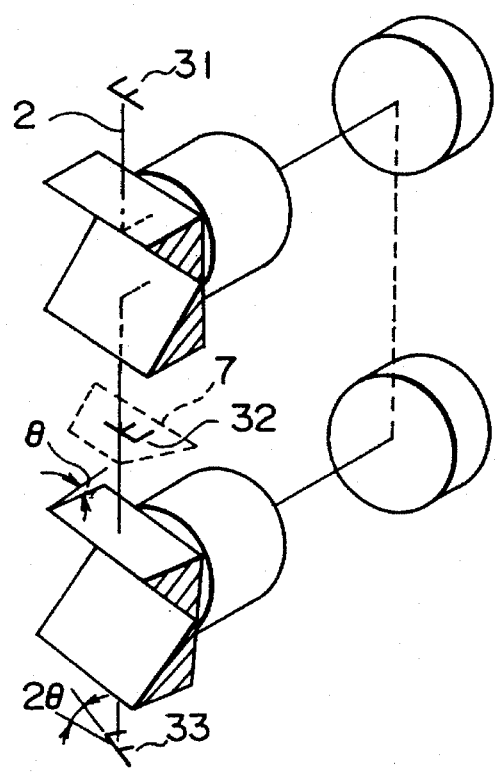
FIG. 6 is a perspective view to illustrate a relation between a rotational angle of reflective surfaces in a projection optical unit and an orientation of an image formed thereby when only the reflective surfaces in a second partial optical system rotate.
Figure 7:
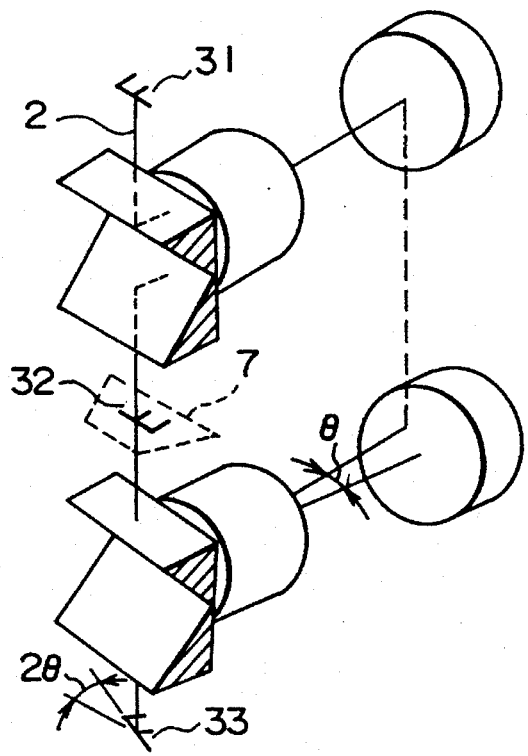
FIG. 7 is a perspective view to illustrate a relation between a rotational angle of the second partial optical system and an orientation of an image formed thereby when the entire second partial optical system rotates.

FIG. 6 and FIG. 7 are drawings to illustrate relations between positional deviation of reflective surfaces in a projection optical unit and orientations of images formed thereby, wherein FIG. 6 shows a case where only the reflective surfaces in the second partial optical system are positionally deviated, while FIG. 7 a case where the entire second partial optical system is positionally deviated.

The projection optical unit shown in FIG. 6 or FIG. 7 is a Dyson type optical system having the structure shown in FIG. 2.

In FIG. 6, when the prism having the first and second reflective surfaces in the second partial optical system rotates by an angle θ about the optical axis 2 in the shown direction, the orientation of the primary image 32 of the projection pattern 31, formed at the position of the field stop 7, remains not affected at all, but the secondary image 33 of the projection pattern 31, formed at the position of the image plane of the projection optical unit, rotates by an angle 2θ about the optical axis 2 in the shown direction.

On the other hand, in FIG. 7, when the entire second partial optical system rotates by the angle θ about the optical axis 2 in the shown direction, the orientation of the primary image 32 of the projection pattern 31, formed at the position of the field stop 7, remains not affected at all, but the secondary image 33 of the projection pattern 31, formed at the position of the image plane of the projection optical unit, rotates by the angle 2θ about the optical axis 2 in the shown direction. In other words, the orientation of the formed image can be adjusted by rotating the reflective surfaces in the projection optical unit about the optical axis 2.

Thus, rotational errors in setting of the reflective surfaces in the respective projection optical units would result in different orientations of images formed through the respective projection optical units, which would in turn result in losing matching between the images formed through the respective projection optical units upon scanning exposure.

Since the grating pattern 15 and grating pattern 16 are located at the positions corresponding to the projection pattern plane and the image plane, respectively, of the projection optical system, the two grating patterns are conjugate with each other. Further, the grating pattern 15 and grating pattern 16 are arranged substantially in parallel with each other and substantially in the same orientation. Therefore, moire fringes can be observed on the image sensor 14.

The pitch p of the observed moire fringes is expressed by the following formula (1), where the pitch of light and dark gratings is d and a relative rotational angle between the two gratings (corresponding to an angle of intersection between the secondary image of the grating pattern 15 and the grating pattern 16) is δ.

$$p = d/\delta \quad (1)$$

Since the pitch d of light and dark gratings is constant, the intersection angle δ should be constant between the secondary image of the grating pattern 15 and the grating pattern 16 as long as the pitch p of the observed moire fringes is constant. Since the pitch p of moire fringes is related to an absolute value of the intersection angle δ between the two grating patterns, there are two conceivable orientations of the secondary image of the grating pattern 15 relative to grating pattern 16.

Accordingly, measuring the pitch of moire fringes with each projection optical unit and properly rotating the reflective surfaces in each projection optical unit about the optical axis, the pitch of moire fringes is adjusted so as to become approximately constant between the projection optical units, whereby errors of orientations between the images formed through the respective projection optical units can be corrected.

Specifically, according to FIG. 6, where correction is made by rotating only the reflective surfaces of prism in the second partial optical system of projection optical unit, the prism needs to be separated from the plano-convex lens. On the other hand, according to FIG. 7, where correction is made by rotating the reflective surfaces together with the entire second partial optical system of projection optical unit, the entire optical system denoted by the reference numeral 20 in FIG. 3 needs to be rotated in the direction of the arrow in the drawing.

Figure 8:
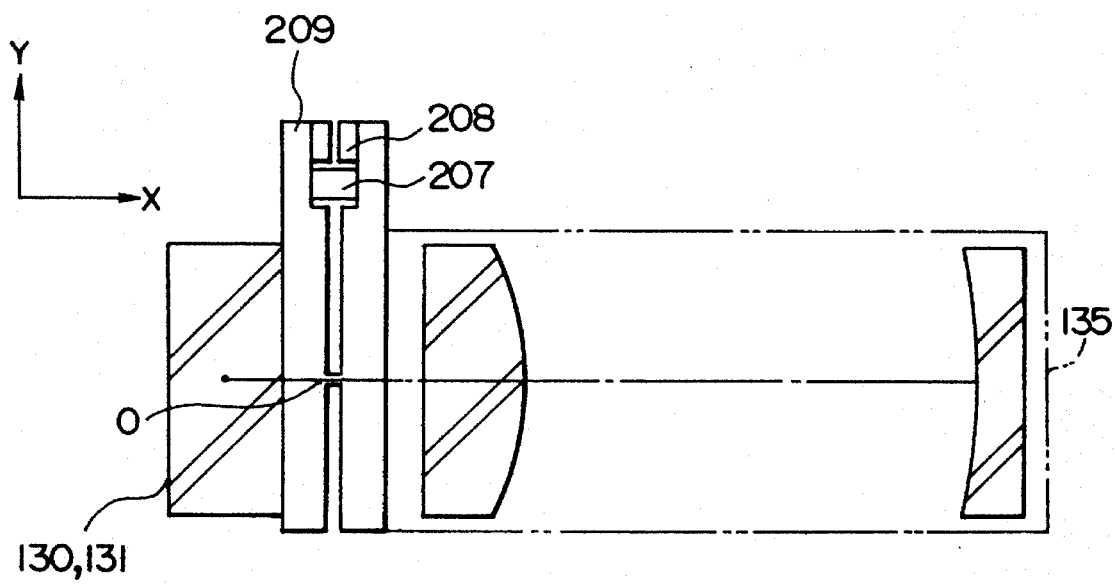
FIG. 8 is a plan view to show the structure of a projection optical unit.
Figure 9:
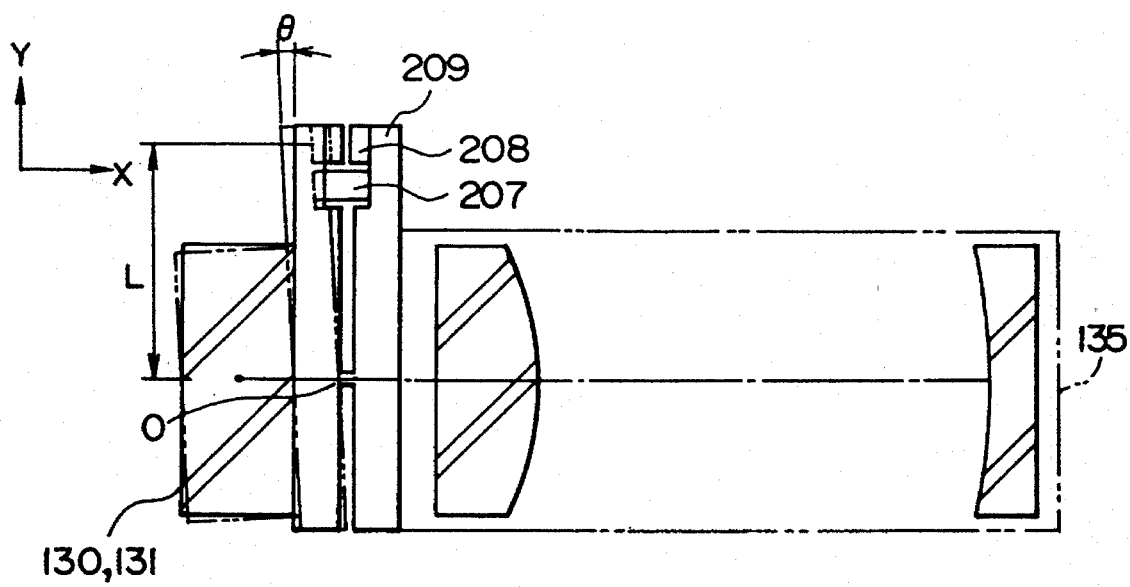
FIG. 9 is a plan view no illustrate an operation of an adjusting mechanism used in the projection optical unit.
Figure 10:
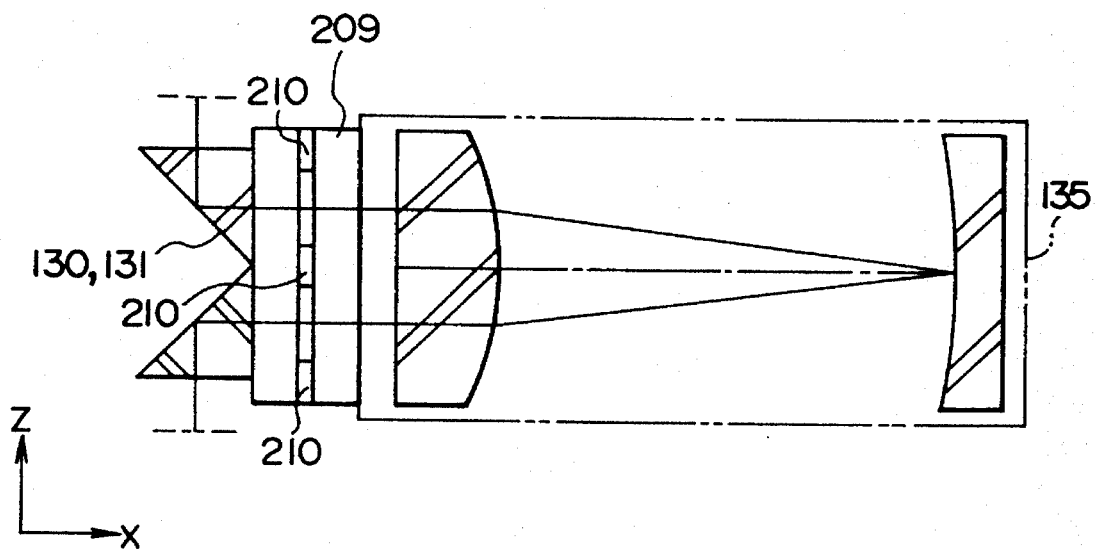
FIG. 10 is a side view to show the structure of the projection optical unit.

FIG. 8 is a plan view to show the structure of one optical system (121 to 124 or 126 to 129) out of the projection optical system (121 to 129) shown in FIG. 4. Also, FIG. 9 is a plan view to show an operational state of an adjusting mechanism (207 to 209) of FIG. 8. FIG. 10 is a side view to show the structure of the one optical system (121 to 124 or 126 to 129) out of the projection optical system (121 to 129) shown in FIG. 4.

In FIG. 8, the prism 130 or 131 is attached to one side of an elastic hinge 209 while a barrel 135 (as shown by chain double-dashed lines in the drawing) supporting a lens component 122 or 127 and a concave mirror 123 or 128 in an incorporated manner is attached to the other side of the elastic hinge 209.

As shown in FIG. 10, elastically deforming portions 210 becoming the rotation center O of the elastic hinge 209 are provided at three positions along the XZ plane including the optical axis (shown by a chain line in the drawing) of the lens component and concave mirror. In this case, the portions becoming the rotation center O are located at the positions where they do not interrupt beams passing through the projection optical system.

Figure 11:
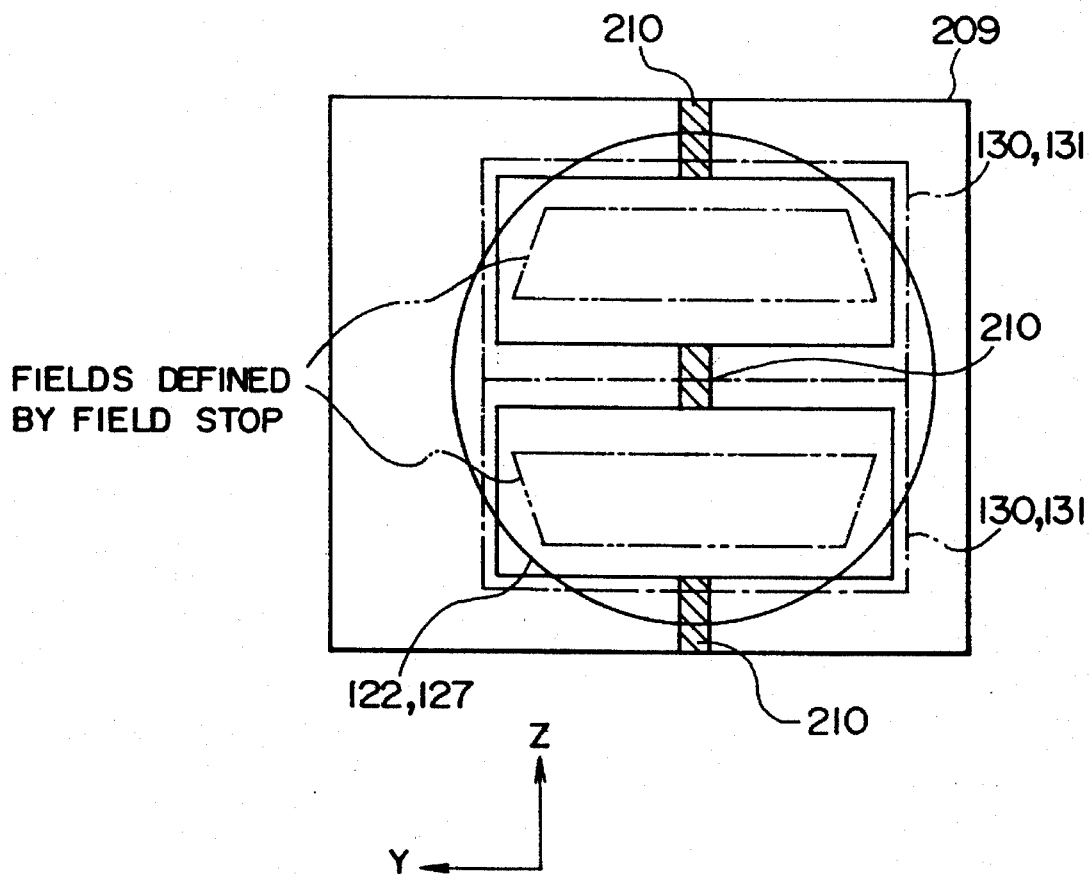
FIG. 11 is a drawing of the projection optical unit as observed along the −X direction in FIG. 10.

This point is briefly described referring to FIG. 11. FIG. 11 is a drawing when FIG. 10 is observed in the −X direction. In FIG. 11, the elastically deforming portions 210 becoming the center axis of rotation are shown by hatched lines. As seen from FIG. 11, the portions becoming the rotation center O are located outside the regions of fields defined by the field stop 125 of FIG. 4.

The adjusting mechanism shown in FIG. 8 or FIG. 9 is composed of a piezoelectric device 207 as an actuator for finely driving the elastic hinge 209, and an electrostatic capacity type sensor 208 for detecting a displacement of the elastic hinge 209 with high accuracy. The elastic hinge 209 can rotate about the elastically deforming portions 210 finely machined. This rotation rotates the reflective surfaces of prism 130, 131, whereby the image is rotated by a rotation amount two times the rotation amount of the reflective surfaces.

Supposing the accuracy of the electrostatic capacity type sensor 208 is 10 nm, a distance L (FIG. 9) between the rotation center O and the electrostatic capacity type sensor 208 is 100 mm, and the resolution of the piezoelectric device 207 is 1 nm, the rotation amount θ of prism 130, 131 can be measured with an accuracy of 10 nm/100 mm=0.1 μrad (0.02").

In the case of the correction by rotation of the entire projection optical unit as shown in FIG. 7, the entire projection optical unit can be rotated, similarly as in the above case, by using the elastic hinge having the elastically deforming portions, high-accuracy displacement sensor, and actuator for fine drive.

Moreover, if the distance between the prism 130, 131 and the plano-convex lens is short, it is allowable that the elastically deforming portion 210 is arranged at the end of the elastic hinge 209 in the −Y direction. In this case, an elastically deforming portion is provided at a position along the XY plane excluding the optical axis.

Figure 12:
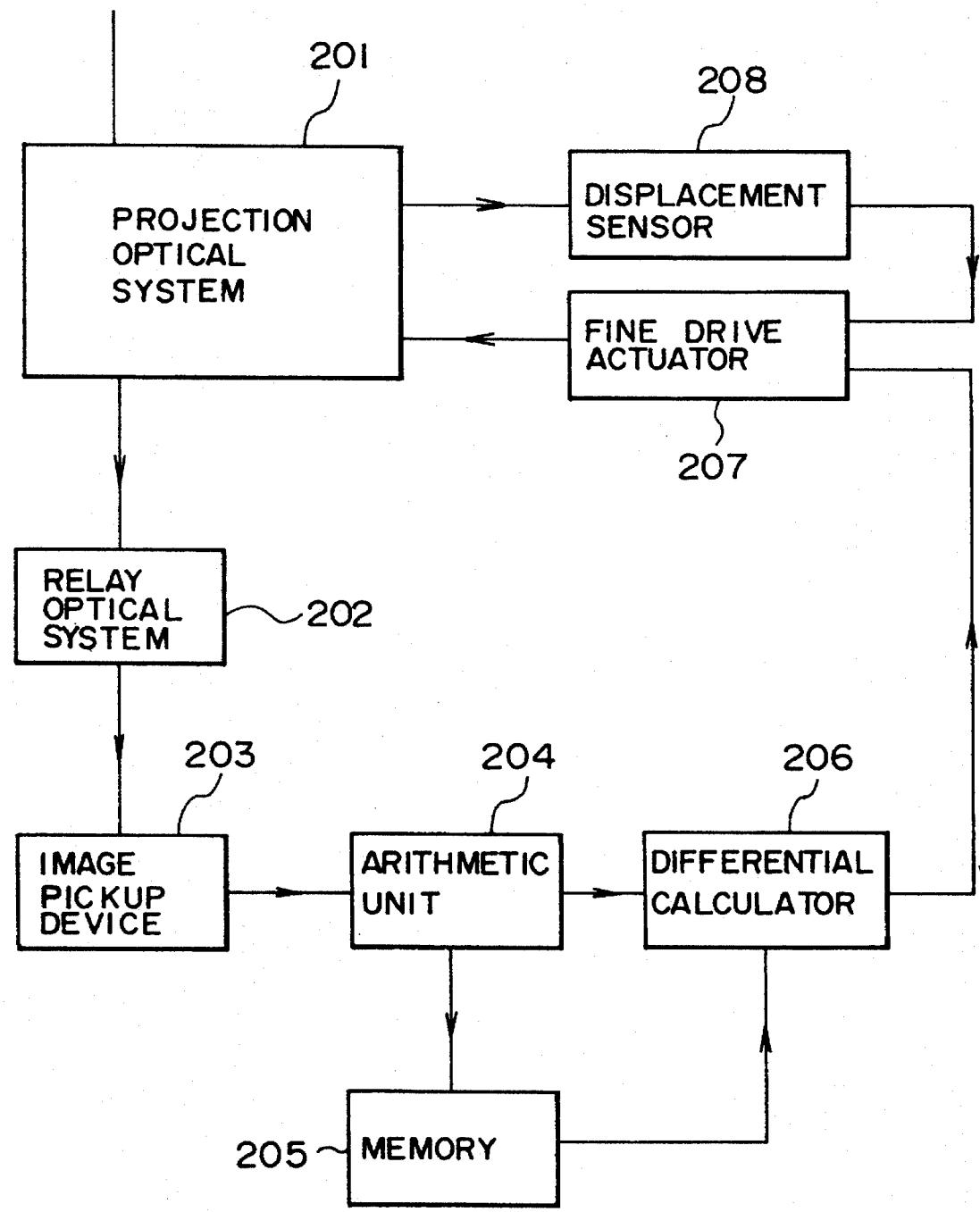
FIG. 12 is a block diagram to show the overall structure of the projection optical apparatus in the embodiment of the present invention.
Figure 13:
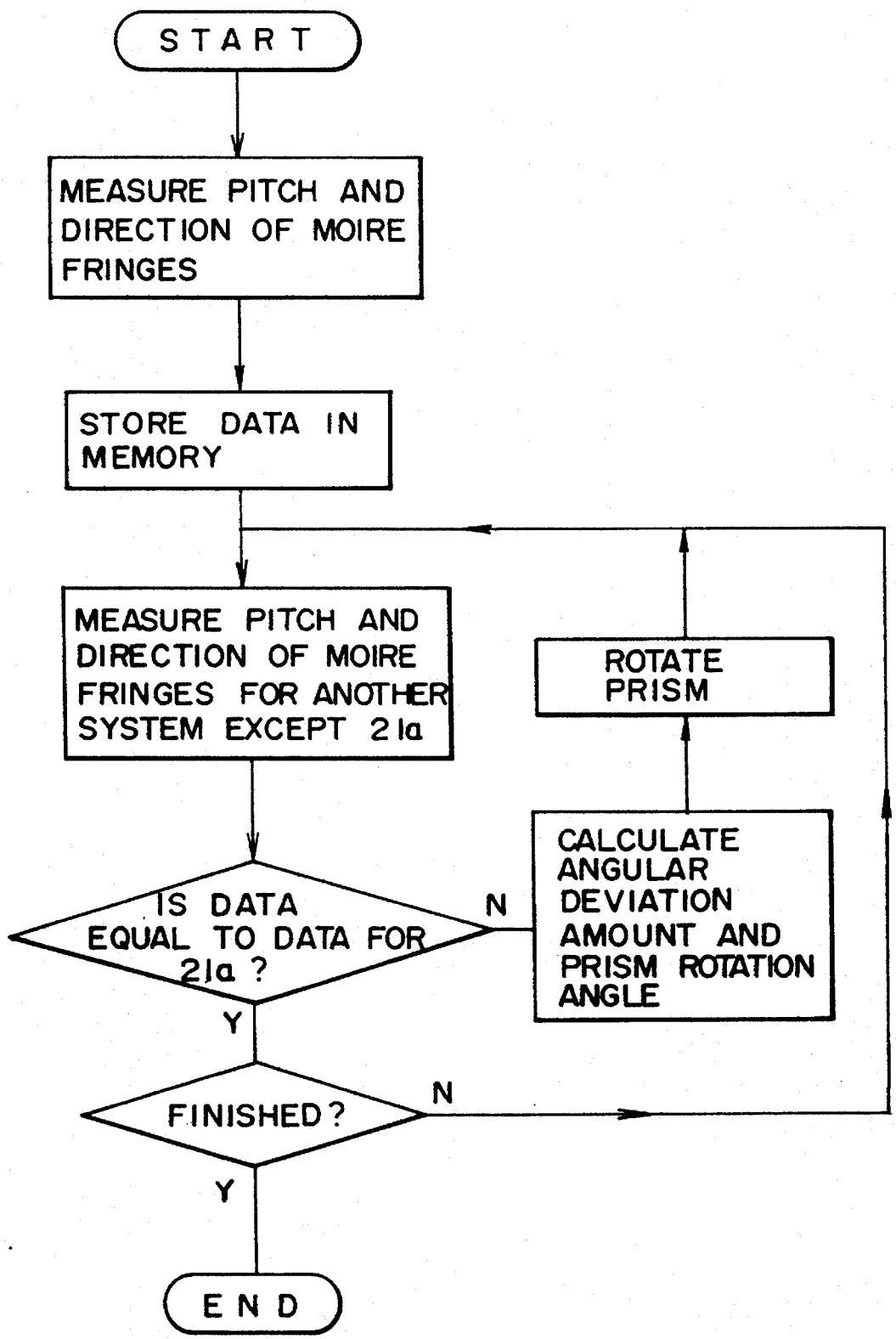
FIG. 13 is a flowchart to show a schematic flow of an adjusting operation in the projection optical apparatus in the embodiment of the present invention.

FIG. 12 is a block diagram of the present embodiment and FIG. 13 a flowchart to show the adjusting operation in the present embodiment.

In FIG. 12, a relay optical system 202 (corresponding to the imaging lens 13 in FIG. 4) has an expansion magnification to form an expanded image of moire fringes on an image pickup surface of an image pickup device 203 (corresponding to the image sensor 14 in FIG. 4). An arithmetic unit 204 measures the pitch of the moire fringes, based on an output from the image pickup device 203. Also, the arithmetic unit 204 makes a memory 205 store this pitch of the moire fringes. A differential calculator 206 calculates a difference between a pitch of moire fringes and the pitch of moire fringes stored in the memory, and drives a fine drive actuator 207 so as to keep the difference constant.

An example of the adjusting operation is next described referring to FIG. 4 and FIG. 8 to FIG. 13.

[Step 0]

First, the arithmetic unit 204 moves the carriage 170 in the X direction and the image pickup unit 145 in the Y direction so that the image pickup unit 145 comes to be located in the field of the projection optical system 21a (corresponding to 102a in FIG. 1).

[Step 1]

Rotating the prism 130, 131 by the elastic hinge 209, the arithmetic unit 204 detects the pitch p of moire fringes formed on the image sensor 14 and the direction of rotational angle δ between the gratings by the image pickup unit 145.

[Step 2]

The detection results at step 1 are stored in the memory 205.

[Step 3]

The arithmetic unit 204 determines if the adjustment is completed for all projection optical systems. In this description, the arithmetic unit goes to step 4, because the adjustment is not completed for the projection optical systems 21b and 21c.

[Step 4]

The arithmetic unit 204 executes step 0 and step 1 for the projection optical system 21b, and then goes to step 5.

[Step 5]

It is determined through the differential calculator 206 if the pitch p and the direction of rotational angle δ for the projection optical system 21b are equal to those for the projection optical system 21a stored in the memory 205. If they are not equal to each other, the arithmetic unit 204 goes to next step 6; if they are equal, it goes to step 11.

[Step 6]

The arithmetic unit 204 drives the fine drive actuator 207 so as to keep the output from the differential calculator 206 constant. On this occasion, the displacement sensor 208 monitors the rotational angle and rotational direction of prism. After that, the arithmetic unit goes to step 7.

[Step 7]

The arithmetic unit 204 determines if the adjustment is completed for all projection optical systems. In this description, it goes to step 8, because the adjustment is not completed for the projection optical system 21c.

[Step 8]

The arithmetic unit 204 executes step 0 and step 1 for the projection optical system 21c, and goes to step 9.

[Step 9]

It is determined through the differential calculator 206 if the pitch p and the direction of rotational angle δ for the projection optical system 21c are equal to those for the projection optical system 21a stored in the memory 205. If they are not equal to each other, the arithmetic unit 204 goes to next step 10; if they are equal, it goes to step 11.

[Step 10]

The arithmetic unit 204 drives the fine drive actuator 207 so as to keep the output from the differential calculator 206 constant. On this occasion, the displacement sensor 208 monitors the rotational angle and rotational direction of prism.

[Step 11]

The arithmetic unit 204 determines if the adjustment is completed for all projection optical systems 21a to 21c. The operation is ended here because the adjustment is completed for all projection optical systems 21a to 21c.

The flowchart of FIG. 13 shows the schematic flow of the above operation.

Although the above description concerns an example of three projection optical systems 21a to 21c, the adjustment operation is the same for cases where four or more projection optical systems are present (for example, as shown in FIG. 1).

Further, the above description concerns the example in which the reference is taken on the projection optical system 21a, but the reference may be set on any one of the projection optical systems.

In actual projection exposure apparatus, the projection optical system is composed of a lot of projection optical units. Accordingly, it is preferred that a pair of grating patterns 15 and 16 be arranged to occupy the entire region of the projection optical system, but the correction operation may be arranged to be effected over the entire projection optical system while successively moving the grating patterns occupying regions of at least two arbitrary adjacent projection optical units in the projection pattern plane and in the image plane, respectively.

Since the actual grating patterns have errors of grating pitch, it is preferred that measurement of the pitch of moire fringes be performed by reference to an average pitch in the entire observation field.

As described, the present embodiment is so arranged as to measure the errors of orientations of images between the projection optical units, due to assembling errors etc. of the projection optical units, and to finely correct the errors of orientations of images between the projection optical units, based on the measurement results, whereby respective pattern images through the projection optical units can be transferred with excellent matching onto the plate.

Also, the scanning exposure can be always stably made by periodically performing the above fine adjustment.

The present invention was described with the examples where the projection optical units each are composed of two Dyson type partial optical systems, but the projection optical units each may be composed of two Offner type partial optical systems or may be composed of one or two partial optical systems of another reflection type.

Although the above embodiment was so arranged that the receiving lens 13 and image sensor 14 as observing means were arranged movable, a plurality of receiving lenses and image sensors may be arranged below the respective projection optical units (on the image side of the respective projection optical units). In this case, the respective receiving lenses are preferably set so that the optical axis of each of the plural receiving lenses is coincident with that of each of the projection optical units.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 339770/1993 filed on Dec. 6, 1993 is hereby incorporated by reference.

What is claimed is:

1. A projection exposure apparatus which is arranged to relatively move first and second substrates relative to a projection optical system, thereby projecting a pattern formed on said first substrate through said projection optical system onto said second substrate to effect exposure thereon, wherein said projection optical system is provided with a plurality of projection optical units each forming a real-size erect image of the pattern formed on said first substrate, on said second substrate;

wherein each of said projection optical units has a plurality of reflective surfaces and is telecentric at least on an image side;

which comprises correcting mechanism disposed to correct an error of orientation between a plurality of images formed on said second substrate by said plurality of projection optical units.

2. A projection exposure apparatus according to claim 1, wherein said correcting mechanism comprises:

a first light and dark grating having a constant pitch and located at a position corresponding to a projection pattern plane of said projection optical system;

a second light and dark grating having the same pitch as that of said first light and dark grating and located at a position corresponding to an image plane of said projection optical system;

observing means for observing moire fringes resulting from an image of said first light and dark grating by said projection optical unit, and said second light and dark grating; and positioning correcting means for correcting a positioning state of said plurality of projection optical units, based on the moire fringes observed by said observing means.

3. A projection exposure apparatus according to claim 1, wherein said projection optical unit comprises an Offner type optical system having at least one concave mirror and at least one convex mirror.

4. A projection exposure apparatus according to claim 1, wherein said projection optical unit comprises a Dyson type optical system having a lens surface with a concave surface directed toward an entrance side of light, and a reflective surface also with a concave surface directed toward the entrance side of light.

5. A projection exposure apparatus according to claim 1, wherein said projection optical unit comprises:
   a first partial optical system for forming an intermediate image of the pattern formed on said first substrate; and
   a second partial optical system for re-imaging said intermediate image on said second substrate.

6. A projection exposure apparatus according to claim 2, wherein said positioning correcting means corrects a direction of reflective surfaces in said projection optical unit.

7. A projection exposure apparatus according to claim 2, wherein said positioning correcting means corrects a direction of the whole of said projection optical unit.

8. A projection exposure apparatus according to claim 2, wherein said first and second light and dark gratings occupy a projection region of at least two arbitrary adjacent said projection optical units, and are arranged as movable in the projection pattern plane and in the image plane, respectively, of said projection optical system.

9. A projection exposure apparatus according to claim 2, wherein said first and second light and dark gratings occupy an entire projection region of said projection optical units.

10. A projection exposure apparatus according to claim 2, wherein said observing means comprises a light-receiving optical system for forming an image of said moire fringes with illumination light having passed through said first and second light and dark gratings and said projection optical unit, and light-receiving means for photoelectrically converting the image of said moire fringes;
   wherein said light-receiving optical system is telecentric at least on the side of said projection optical unit.

11. A projection exposure apparatus according to claim 2, wherein said positioning correcting means comprises:
   an elastic hinge for elastically supporting at least part of said projection optical unit;
   an actuator for finely driving the part supported by said elastic hinge; and
   a displacement sensor for measuring a displacement of the part supported by said elastic hinge.

12. A projection exposure apparatus according to claim 11, wherein said actuator is a piezoelectric device.

13. A projection exposure apparatus according to claim 11, wherein said displacement sensor is of an electrostatic capacity type.

14. A projection exposure apparatus according to claim 11, further comprising a field stop,
   wherein said projection optical unit comprises a first partial optical system for forming an intermediate image of the pattern formed on said first substrate, and a second partial optical system for re-imaging said intermediate image on said second substrate; and
   wherein said field stop is set at a position of said intermediate image formed by said first partial optical system and an image of said elastic hinge projected on said second substrate is outside a field defined by said field stop.

15. A projection exposure apparatus for transferring a pattern formed on a first substrate onto a second substrate, comprising:
   a first projection optical system for projecting a real-size erect first image which corresponds to a first part of the pattern formed on said first substrate onto said second substrate, said first projection optical system having a plurality of reflective surfaces, and said first projection optical system being telecentric at least on an image side;
   a second projection optical system for projecting a real-size erect second image which corresponds to a second part of the pattern formed on said first substrate onto said second substrate, said second projection optical system having a plurality of reflective surfaces, said second projection optical system being telecentric at least on an image side, said second image being adjacent to said first image, said second part being adjacent to said first part, and at least one of said reflective surfaces of said first and second projection optical systems being rotatable for correcting an error of orientation of said first and second images;
   a first stage for supporting said first substrate, said first stage moving said first substrate relative to said first and second projection optical systems;
   a second stage for supporting said second substrate, said second stage moving said second substrate relative to said first and second projection optical systems; and
   a correcting mechanism for correcting an error of orientation between said first image and second image.

16. A projection exposure method for transferring a pattern by a projection exposure apparatus which comprises:
   a first projection optical system for projecting a real-size erect first image which corresponds to a first part of the pattern formed on said first substrate onto said second substrate, said first projection optical system having a plurality of reflective surfaces, and said first projection optical system being telecentric at least on an image side;
   a second projection optical system for projecting a real-size erect second image which corresponds to a second part of the pattern formed on said first substrate onto said second substrate, said second projection optical system having a plurality of reflective surfaces, said second projection optical system being telecentric at least on an image side, said second image being adjacent to said first image, said second part being adjacent to said first part, and at least one of said reflective surfaces of said first and second projection optical systems being rotatable for correcting an error of orientation of said first and second images;
   a first stage for supporting said first substrate, said first stage moving said first substrate relative to said first and second projection optical systems;
   a second stage for supporting said second substrate, said second stage moving said second substrate relative to said first and second projection optical systems; and
   a correcting mechanism,
   said projection exposure method comprising:
      a step of correcting an error of orientation between said first image and second image by said correcting mechanism; and
      a step of exposing said second substrate thereby transferring the pattern formed on said first substrate onto said second substrate.

* * * * *